(12) United States Patent
Rao et al.

(10) Patent No.: US 11,982,704 B2
(45) Date of Patent: May 14, 2024

(54) ELECTRONIC DEVICE

(71) Applicant: E Ink Holdings Inc., Hsinchu (TW)

(72) Inventors: Ruei-Huan Rao, Hsinchu (TW); Te-Lung Cheng, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 573 days.

(21) Appl. No.: 17/216,708

(22) Filed: Mar. 30, 2021

(65) Prior Publication Data

US 2021/0318374 A1    Oct. 14, 2021

(30) Foreign Application Priority Data

Apr. 14, 2020   (TW) ................ 109112476

(51) Int. Cl.
*G01R 31/28* (2006.01)
*H05K 1/11* (2006.01)
(52) U.S. Cl.
CPC .......... *G01R 31/2812* (2013.01); *H05K 1/111* (2013.01); *H05K 2201/09245* (2013.01); *H05K 2201/09336* (2013.01); *H05K 2201/09409* (2013.01); *H05K 2201/10287* (2013.01)
(58) Field of Classification Search
CPC ..... G01R 31/2812; H05K 2201/09245; H05K 2201/09336; H05K 2203/162; H05K 1/0268
See application file for complete search history.

(56) References Cited

U.S. PATENT DOCUMENTS

| | | | |
|---|---|---|---|
| 6,522,073 | B2 | 2/2003 | Wu et al. |
| 8,314,785 | B2 | 11/2012 | Kim et al. |
| 8,314,787 | B2 | 11/2012 | Ito |
| 2009/0014717 | A1 | 1/2009 | Kuo et al. |
| 2014/0091819 | A1* | 4/2014 | Gong ............... G01R 31/31926 324/750.3 |
| 2017/0196080 | A1* | 7/2017 | Meng ..................... H05K 1/14 |
| 2019/0116672 | A1 | 4/2019 | Zhao et al. |

FOREIGN PATENT DOCUMENTS

| | | |
|---|---|---|
| CN | 101515018 A | 8/2009 |
| TW | 201116887 A | 5/2011 |
| TW | M564172 U | 7/2018 |

OTHER PUBLICATIONS

Corresponding Chinese office action dated Mar. 23, 2022.
Corresponding Taiwan office action dated Nov. 5, 2020.

* cited by examiner

*Primary Examiner* — Christopher E Mahoney
(74) *Attorney, Agent, or Firm* — CKC & Partners Co., LLC

(57) ABSTRACT

An electronic device includes a first substrate having a first bonding region, a first circuit, a second circuit, a third circuit, and a plurality of first conductive contacts. The first and second circuit are located at a first edge and a second edge of the first bonding region, the third circuit is located between the first and the second circuits. A second substrate having a second bonding region corresponding to the first bonding region in position and a fourth circuit, a fifth circuit, a sixth circuit, and a plurality of second conductive contacts. When the first substrate is bonded with the second substrate, the first circuit, the second circuit, the third circuit, the fourth circuit, the fifth circuit, and the sixth circuit form a loop, and the first and second conductive contacts are electrically connected to a plurality of signal circuits.

20 Claims, 7 Drawing Sheets

ELECTRONIC DEVICE

CROSS-REFERENCE TO RELATED APPLICATION

This application claims priority to Taiwan Application Serial Number 109112476, filed Apr. 14, 2020, which is herein incorporated by reference in its entirety.

BACKGROUND

Field of Invention

The present invention relates to an electronic device.

Description of Related Art

In order to detect bonding efficiency, an electronic device nowadays may include detecting circuits in the bonding region. However, the detecting circuits may merely utilized for detecting bonding situation at the periphery region of the bonding region, but not the central region of the bonding region.

Accordingly, it is still a development direction for the industry to provide a detecting circuit design in the bonding region so as to detecting poor bonding at the central region of the bonding region.

SUMMARY

The invention provides an electronic device.

In some embodiments, the electronic device includes a first substrate and a second substrate. The first substrate has a first bonding region, a first circuit, a second circuit, a third circuit, and a plurality of first conductive contacts. The first circuit is located at a first edge of the first bonding region. The second circuit is located at a second edge opposite to the first edge of the first bonding region. The third circuit is located between the first circuit and the second circuit. A portion of the first conductive contacts are located between the first circuit and the third circuit, and another portion of the first conductive contacts are located between the second circuit and the third circuit. The second substrate has a second bonding region corresponding to the first bonding region in position and a fourth circuit. A fifth circuit, a sixth circuit, and a plurality of second conductive contacts respectively correspond to the first circuit, the second circuit, the third circuit, and the first conductive contacts in positions. When the first substrate is bonded with the second substrate, the first circuit, the second circuit, the third circuit, the fourth circuit, the fifth circuit, and the sixth circuit form a loop, and the first conductive contacts and the second conductive contacts are electrically connected to a plurality of signal circuits corresponding to the first conductive contacts and the second conductive contacts.

In some embodiments, the first bonding region includes a central region, the second bonding region includes a central region, the third circuit is located in the central region of the first bonding region, and the sixth circuit is located in the central region of the second bonding region.

In some embodiments, the first conductive contacts are electrically connected to the signal circuits of an active region, and the second conductive contacts are electrically connected to the signal circuits of a printed circuit board.

In some embodiments, the first circuit, the second circuit, the third circuit, the fourth circuit, the fifth circuit, and the sixth circuits are electrically insulated from the signal circuits.

In some embodiments, the first substrate further includes an extension circuit electrically connected to the first circuit and the third circuit, the extension circuit is located between the first bonding region and an edge of the first substrate, and the extension circuit is located at a side of the first bonding region away from the active region.

In some embodiments, the fourth circuit, the fifth circuit, and the sixth circuit of the second substrate are spaced apart from each other.

In some embodiments, the first circuit, the second circuit, and the third circuit extend outside the first bonding region, and the extension circuit is located outside the first bonding region.

In some embodiments, the second substrate further includes a detecting region, the detecting region includes at least one detecting contact, and the detecting contact is connected to the fourth circuit and the fifth circuit.

In some embodiments, the detecting region is located outside the second bonding region.

In some embodiments, the second substrate further includes an extension circuit electrically connected to the fourth circuit and the sixth circuit, and the extension circuit of the second substrate is located in the second bonding region.

In the aforementioned embodiments, since the third circuit of the first substrate and the sixth circuit of the second substrate are respectively located between the first circuit and the second circuit and between the fourth circuit and the fifth circuit, the bonding situation at the position close to the edge of the first bonding region and the second region may also be detected. Comparing to a typical device of which the detecting circuits are merely located at two edges of the bonding region, designs of the first bonding region and the second bonding region may increase the detection precision. In addition, the numbers and distribution of the third circuits and the sixth circuits may be adjusted based on requirements so as to enhance quality of bonding detection. Accordingly, the products which are poorly bonded may be prevented from being misjudged as products that satisfy standards, thereby avoiding low yield in the subsequent processes or of the final products.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
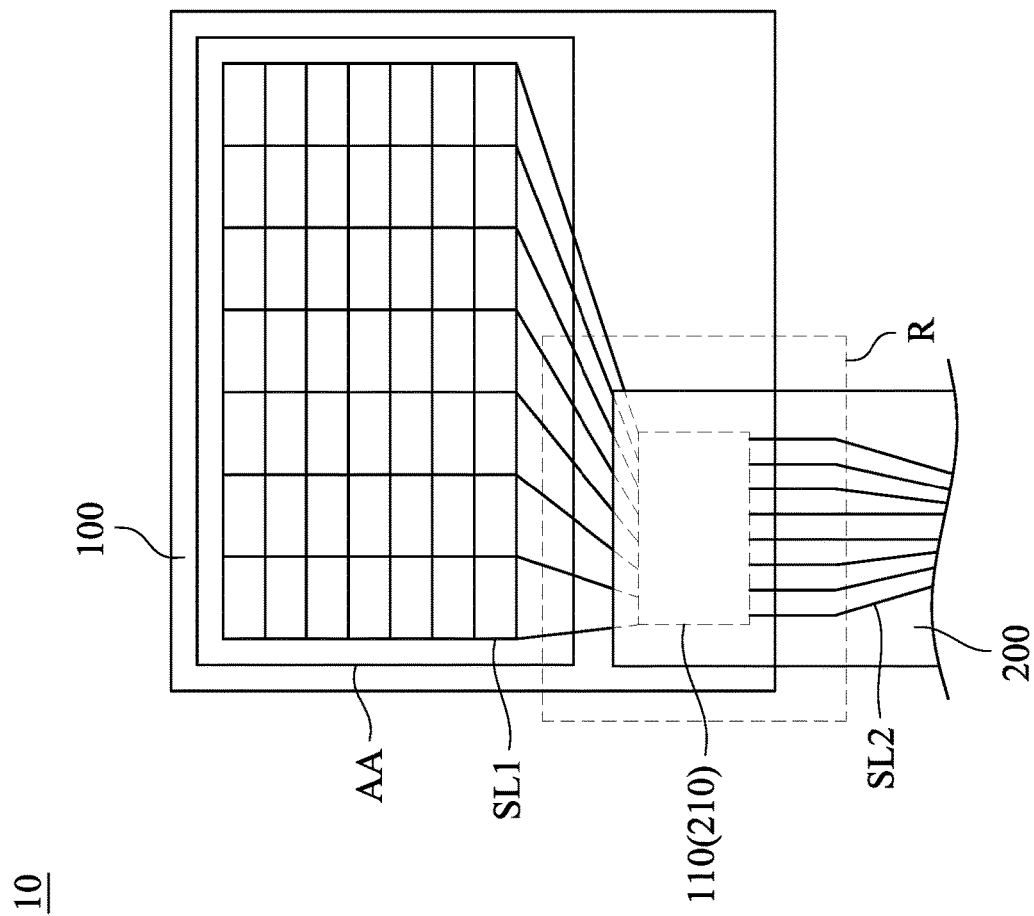
FIG. 1 is a top view of an electronic device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a top view of an electronic device 10 according to one embodiment of the present disclosure. The electronic device 10 includes a first substrate 100 and a second substrate 200. The first substrate 100 has a first bonding region 110 and an active region AA. The second substrate 200 has a second bonding region 210. The second bonding region 210 corresponds to the first bonding region 110 in position, and the first bonding region 110 and the second bonding region 210 are bonded with each other such that the first substrate 100 and the second substrate 200 are electrically connected to each other. The electronic device 10 may be utilized in a mobile phone or a display panel, but the present disclosure is not limited in this regard. The first substrate 100, for example, may be a substrate with driving array, and the second substrate 200 may be a flexible printed circuit board, but the present disclosure is not limited in this regard. In other words, the first substrate 100 and the second substrate 200 are merely required to be electrically connected through the first bonding region 110 and the second bonding region 210.

Figure 2:
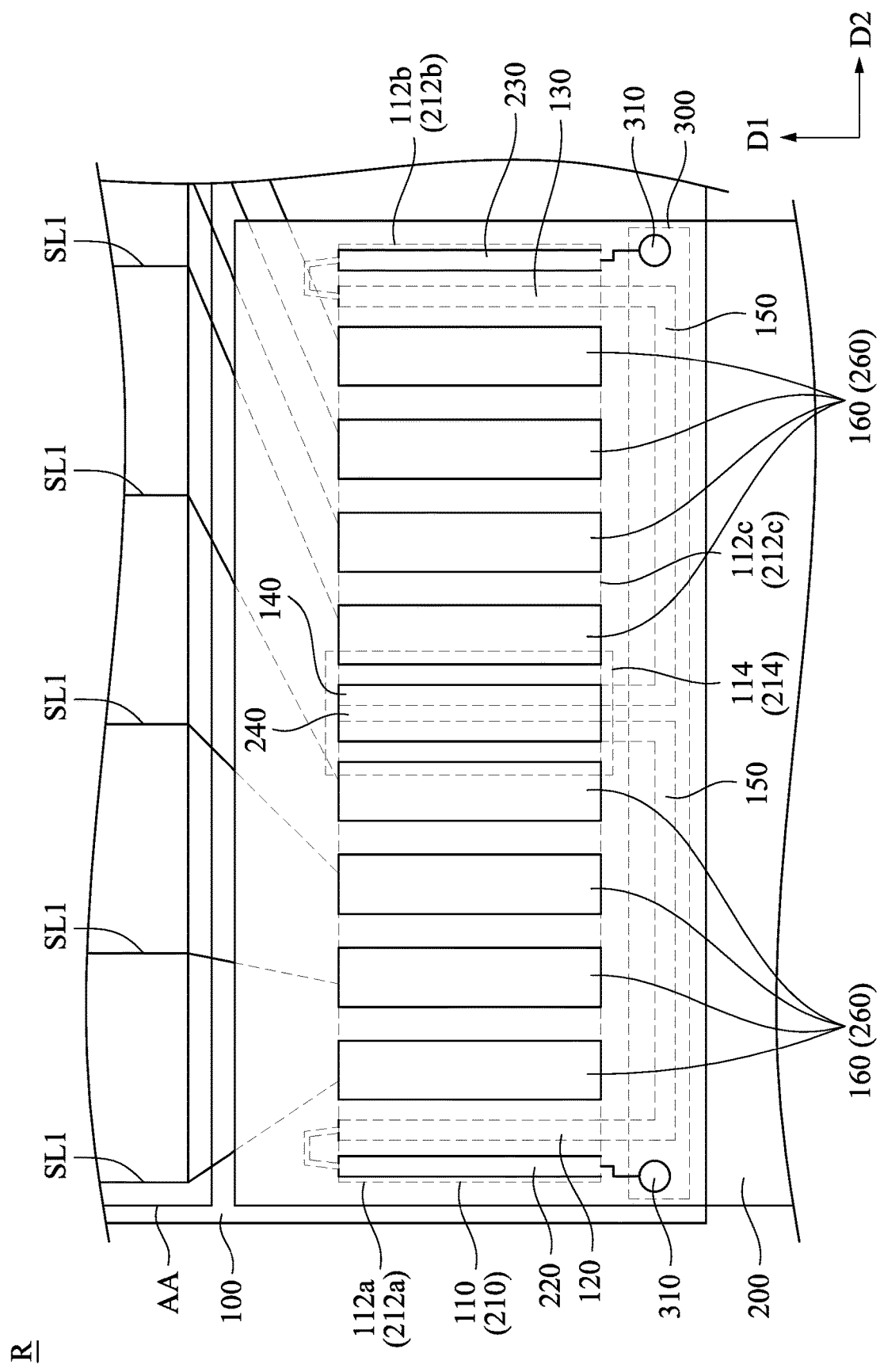
FIG. 2 is an enlarged view of the region R in FIG. 1.
Figure 3:
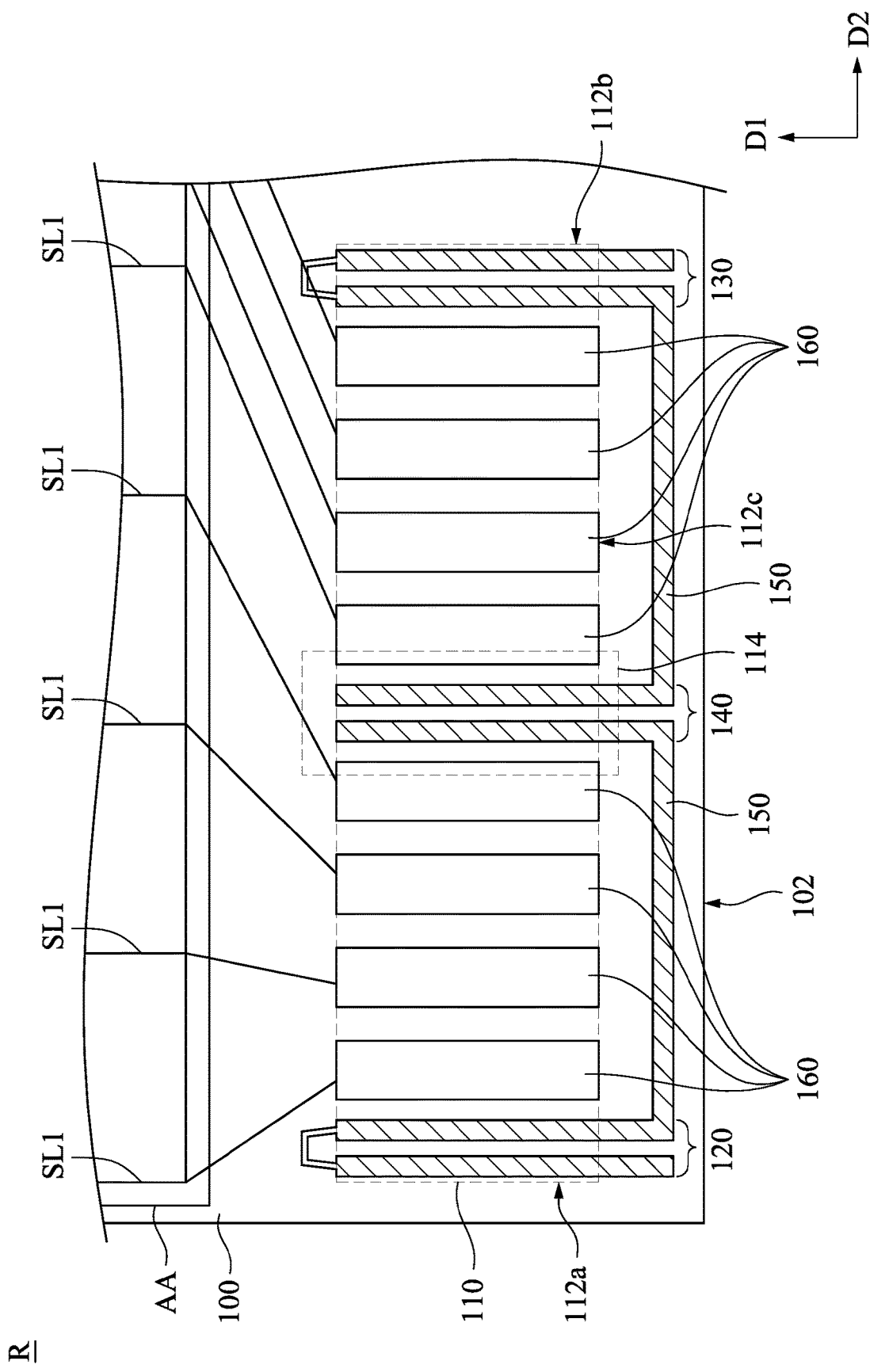
FIG. 3 is a top view of a first substrate in the region R.
Figure 4:
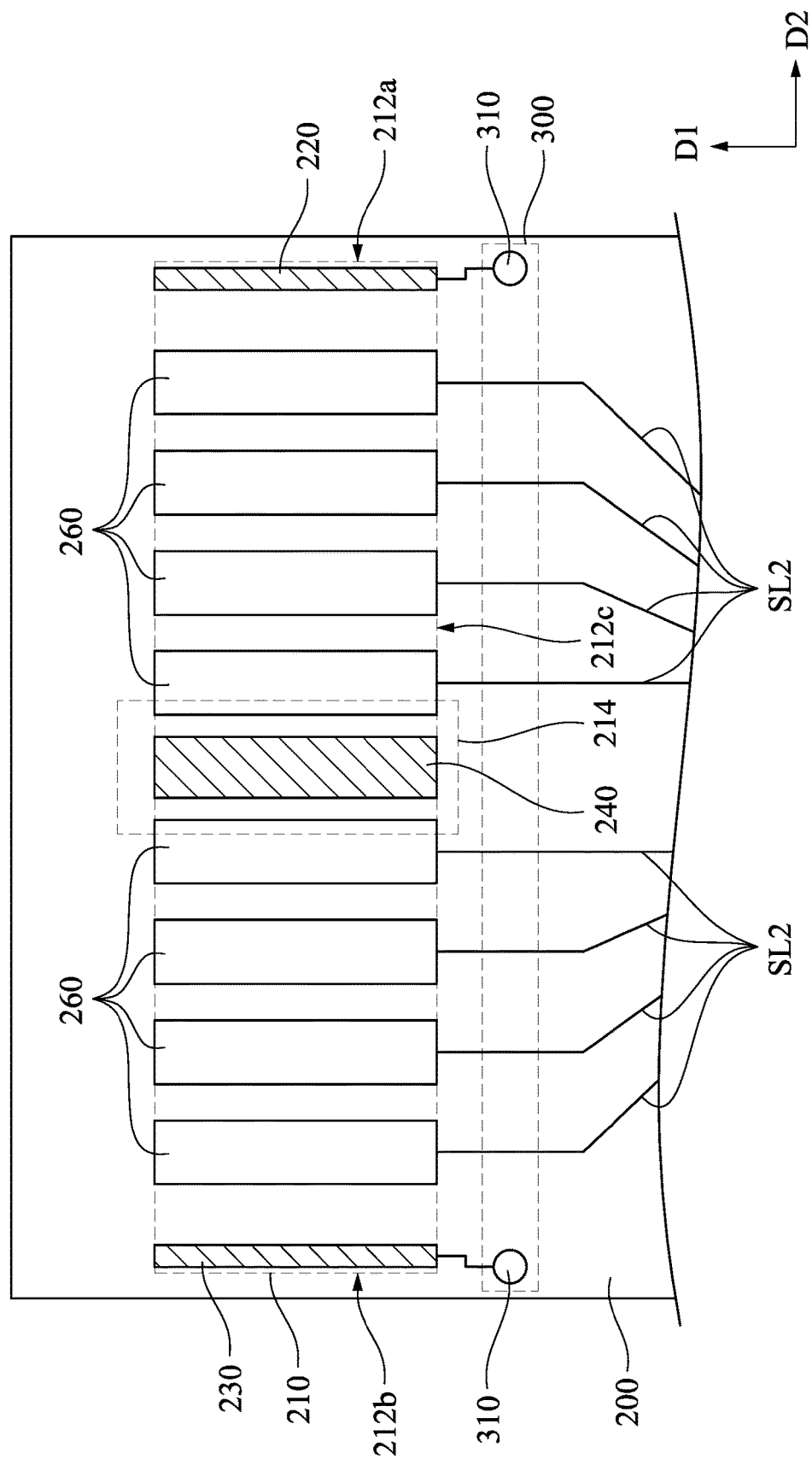
FIG. 4 is a top view of a second substrate in the region R.

FIG. 2 is an enlarged view of the region R in FIG. 1. FIG. 3 is a top view of a first substrate 100 in the region R. FIG. 4 is a top view of a second substrate 200 in the region R. It is noted that the bonded first bonding region 110 and the second bonding region 210 are substantially face each other. Therefore, the structures of the second substrate 200 are not located above the top of the second substrate. However, in order to distinguish the circuits of the first substrate 100 and the second substrate 200, the elements on the second substrate 200 will be illustrated with solid line in FIG. 2, and the elements on the first substrate 100 will be illustrated with dashed line in FIG. 2. Reference is made to FIG. 2, FIG. 3, and FIG. 4. The second substrate 200 is located above the first substrate 100 in FIG. 2, and the second substrate 200 faces the first substrate 100. Therefore, the elements on the second substrate 200 are labeled reversely in FIG. 2 and FIG. 4.

The first bonding region 110 includes a first edge 112a, a second edge 112b and a third edge 112c. The first edge 112a is opposite to the second edge 112b, and the third edge 112c is connected to the first edge 112a and the second edge 112b. As shown in FIG. 3, when the first bonding region 110 and the second bonding region 210 are correspondingly bonded, the third edge 112c of the first bonding region 110 is located at a side of the first substrate 100 close to the edge 102 of the first substrate 100.

The first substrate 100 has a first circuit 120, a second circuit 130, and a third circuit 140. The first circuit 120 is located at the first edge 112a of the first bonding region 110. The second circuit 130 is located at the second edge 112b of the first bonding region 110. The third circuit 140 is located between the first circuit 120 and the second circuit 130. For example, in the present embodiment, the second circuit 130 includes two parallel circuits spaced apart from each other, and the two circuits are electrically connected to the first circuit 120 and the third circuit 140, respectively. However, the present disclosure is not limited in this regard. The first circuit 120, the second circuit 130, and the third circuit 140 of the first substrate 100 extend along the first direction D1.

The first substrate 100 further includes two extension circuits 150. One of the extension circuits 150 is electrically connected to the first circuit 120 and the third circuit 140, and another extension circuit 150 is electrically connected to the third circuit 140 and the second circuit 130. The extension circuits 150 are located at a side of the first bonding region 110 spaced away from the active region AA. In other words, the extension circuits 150 are located between the third edge 112c of the first bonding region 110 and the edge 102 of the first substrate 100. That is, the extension circuits 150 are located outside the first bonding region 110. In the present embodiment, the extension circuits 150 extend along the second direction D2. The second direction D2 is different from the first direction D1. In the present embodiment, the second direction D2 is perpendicular to the first direction D1, but the present disclosure is not limited in this regard.

The second bonding region 210 includes a first edge 212a, a second edge 212b and a third edge 212c. The first edge 212a is opposite to the second edge 212b, and the third edge 212c is connected to the first edge 212a and the second edge 212b. As shown in FIG. 2, the first edge 112a, the second edge 112b, and the third edge 112c of the first bonding region 110 respectively correspond to the first edge 212a, the second edge 212b, and the third edge 212c of the second bonding region 210 in positions.

The second substrate 200 includes a fourth circuit 220, a fifth circuit 230, and a sixth circuit 240. The fourth circuit 220, the fifth circuit 230, and the sixth circuit 240 respectively correspond to the first circuit 120, the second circuit 130, and the fourth circuit 140 of the first substrate 100 in positions. The fourth circuit 220, the fifth circuit 230, and the sixth circuit 240 of the second substrate 200 extend along the first direction D1. As shown in FIG. 2, when the first bonding region 110 and the second bonding region 210 are correspondingly bonded, the first circuit 120 is overlapped with the fourth circuit 220. In addition. The second circuit 130 is overlapped with the fifth circuit 230, and the third circuit 140 is overlapped with the sixth circuit 240. The aforementioned circuits are overlapped along another direction perpendicular to the first direction D1 and the second direction D2.

The first substrate 100 includes a plurality of first conductive contacts 160 in the first bonding region 110, and the second substrate 200 includes a plurality of second conductive contacts 260 in the second bonding region 210. The first conductive contacts 160 respectively correspond to the second conductive contacts 260 in positions. Specifically, the first conductive contacts 160 are electrically connected to the signal circuits SL1 in the active area AA, and the second conductive contacts 260 are electrically connected to the signal circuits SL2 (shown in FIG. 1 and the FIG. 4) of the flexible printed circuit board, but the present embodiment is not limited in this regard. The first conductive circuits 160 and the second conductive circuits 260 may be connected to different signal circuits based on practical requirement.

The first circuit 120 is located between the first edge 112a and the first conductive contacts 160, and the second circuit 130 is located between the second edge 112b and the first conductive contacts 160. The third circuit 140 is located between adjacent two of the first conductive contacts 160. The fourth circuit 220 is located between the first edge 212a and the second conductive contacts 260. The fifth circuit 230 is located between the second edge 212b and the second conductive contacts 260. The sixth circuit 240 is located between adjacent two of the second conductive contacts 260.

A portion of the first conductive contacts 160 is located between the first circuit 120 and the third circuit 140. Another portion of the first conductive contacts 160 is located between the second circuit 130 and the third circuit 140. A portion of the second conductive contacts 260 is located between the fourth circuit 220 and the sixth circuit 240. Another portion of the second conductive contacts 260 is located between the fifth circuit 230 and the sixth circuit 240. In the present, eight first conductive contacts 160 and eight second conductive contacts 260 are demonstrated herein as an example, but the present disclosure is not limited in this regard. In addition, the third circuit 140 of the first substrate 100 is located between adjacent two of the first conductive contacts 160, and the sixth circuit 240 of the second substrate 200 is located between adjacent two of the second conductive contacts 260.

When the first bonding region 110 and the second bonding region 210 are bonded with each other, the first conductive contacts 160 are electrically connected to the second conductive contacts 260 corresponding to the first conductive contacts 160 in positions. The first circuit 120 is electrically connected to the fourth circuit 220, the second circuit 130 is electrically connected to the fifth circuit 230, and the third circuit 140 is electrically connected to the sixth circuit 240.

The first circuit 120, the second circuit 130, and the third circuit 140 of the first substrate 100 are electrically connected to the fourth circuit 220, the fifth circuit 230, and the sixth circuit 240 of the second substrate 200 and those circuits may form a loop. In the present embodiment, the sixth circuit 240 and the third circuit 140 each has two parallel circuits that are electrically connected with each other, such that the aforementioned circuits may electrically connected with each other and form a loop.

In the present embodiment, the fourth circuit 220, the fifth circuit 230, and the sixth circuit 240 of the second substrate 200 may be separated from each other. The third circuit 140 is electrically connected to the first circuit 120 and the second circuit 130 respectively located at the first edge 112a and the second edge 112b and electrically connected to the fourth circuit 220 and the fifth circuit 230 respectively located at the first edge 212a and the second edge 212b so as to form a loop. In some other embodiments, the designs of the first bonding region 110 and the second bonding region 210 can be reversed. For example, the first circuit 120, the second circuit 130, and the fourth circuit 140 in the first bonding region 110 may be located on the second substrate 200, and the fourth circuit 220, the fifth circuit 230, and the sixth circuit 240 in the second bonding region 210 may be located on the first substrate 100. In addition, the third circuit 140 may has single circuit, as long as those circuits in the first bonding region 110 and the second bonding region 210 may form a loop and the impedance may be measured through detecting contacts 310.

The second substrate 200 further includes a detecting region 300 located at a side of the second bonding region 210 close to the third edge 212c. As shown in FIG. 2, the detecting region 300 is located at a side spaced away from the active region AA. That is, the detecting region 300 is located between the edge 102 and the first bonding region 110 of the first substrate 100. The detecting region 300 further includes two detecting contacts 310 respectively connected to the fourth circuit 220 and the fifth circuit 230 of the second substrate 200. Since the first circuit 120, the second circuit 130, and the third circuit 140 of the first substrate 100 are electrically connected to the fourth circuit 220, the fifth circuit 230, and the sixth circuit 240 when the first bonding region 110 and the second bonding region 210 are bonded with each other, these circuits may form a loop of which the impedance may be detected through the detecting contacts 310 so as to examine the bonding completeness. As such, when poor bonding occurs between the first bonding region 110 and the second bonding region 210 such that the electrically connection of the aforementioned circuits is incomplete, an abnormal impedance can be measured through the detecting contacts 210. The detecting contacts 310 described above may be designed on the first substrate 100.

In addition, since the third circuit 140 and the sixth circuit 240 are respectively located between the first circuit 120 and the second circuit 130 and between the fourth circuit 220 and the fifth circuit 230, the bonding situation at the position close to the edge (e.g., first edge 112a, 212a and the second edge 112b, 212b) of the first bonding region 110 and the second bonding region 210 may also be detected. Comparing to a typical device of which the detecting circuits are merely located at two edges of the bonding region, designs of the first bonding region 110 and the second bonding region 210 may increase the detection precision. Accordingly, the products which are poorly bonded may be prevented from being misjudged as products that satisfy standards, thereby avoiding low yield in the subsequent processes or of the final products.

In the present embodiment, the first bonding region 110 further includes a central region 114 located between the first edge 112a and the second edge 112b. The central region 114 includes a center of the first bonding region 110. The third circuit 140 is located in the central region 114 of the first bonding region 110. The second bonding region 210 further includes a central region 214 located between the first edge 212a and the second edge 212b. The central region 214 includes a center of the second bonding region 210. The sixth circuit 240 is located in the central region 214 of the second bonding region 210. For example, when lengths of the first bonding region 110 and the second bonding region 210 are longer, the poor bonding situation may occur more frequently in the central region 114 of the first bonding region 110 and the central region 214 of the second bonding region 210. Therefore, the detection precision for poorly bonded products may be increased by disposing the third circuit 140 in the central region 114 of the first bonding region 110 and by disposing the sixth circuit 240 in the central region 214 of the second bonding region 210.

In the present embodiment, the first circuit 120, the second circuit 130, and the third circuit 140 extend outside the first bonding region 110 so as to be connected with the extension circuits 150. In some embodiments, there is no circuit corresponding to the extension circuits 150 of the first substrate 100 in the second substrate 200. In other embodiments, the fourth circuit 220, the fifth circuit 230, the sixth circuit 240 may also include circuits corresponding to the extension circuits 150 as long as the impedance of the loop formed after the first bonding region 110 and the second bonding region 210 are bonded can be measured through the detecting contacts 310.

Figure 5:
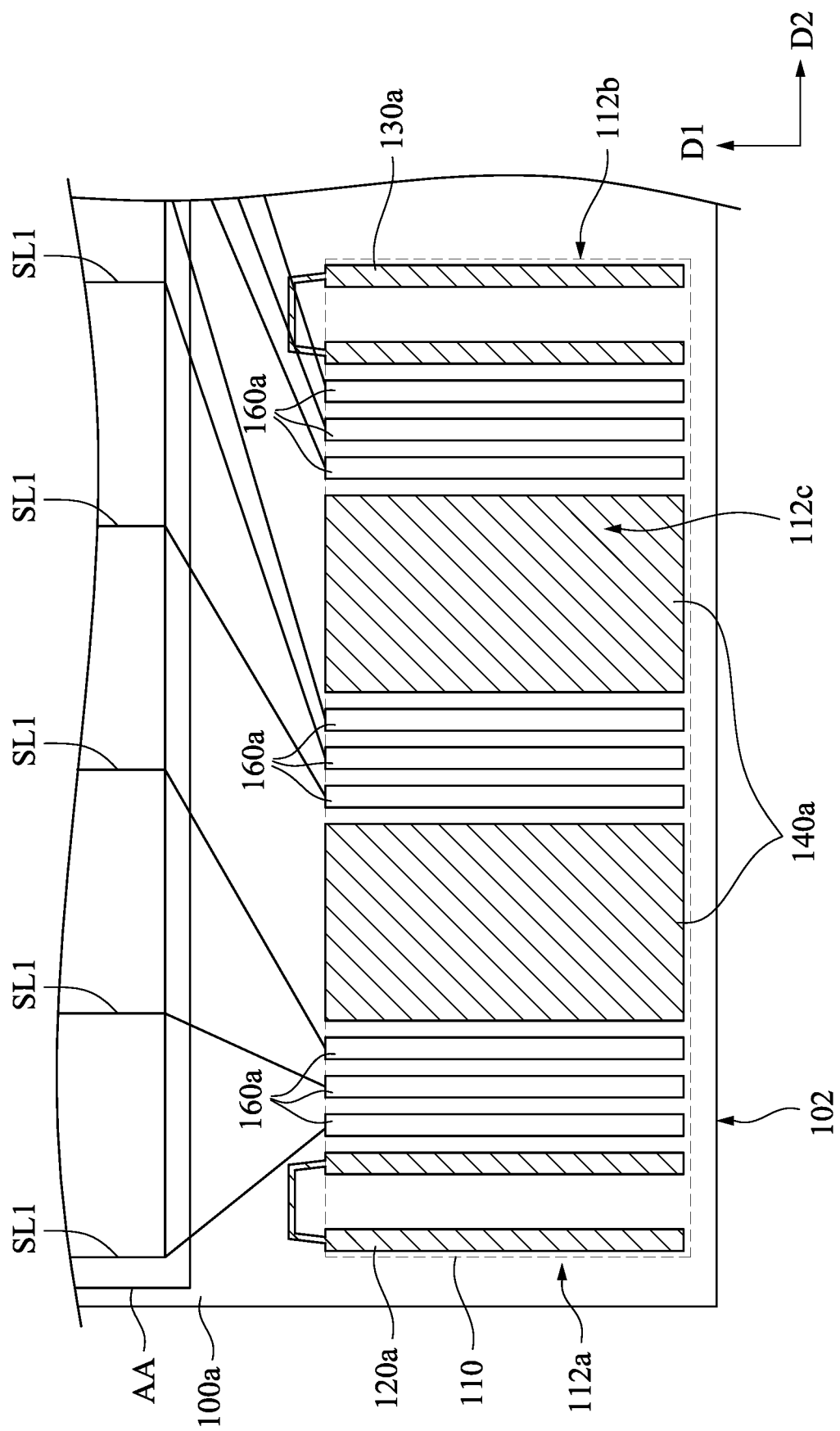
FIG. 5 is a top view of a first substrate according to another embodiment of the present disclosure.
Figure 6:
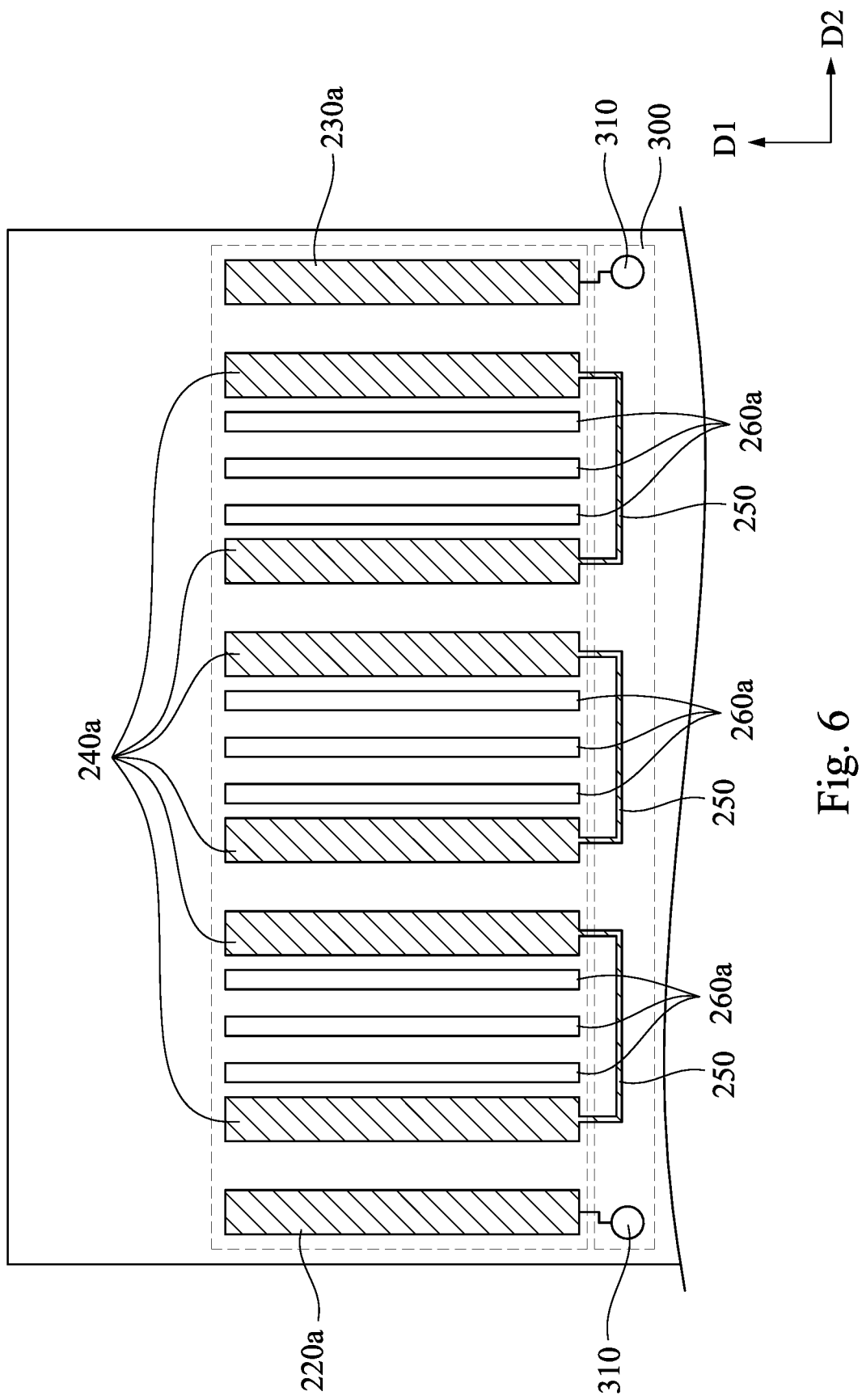
FIG. 6 is a top view of a second substrate according to another embodiment of the present disclosure.

FIG. 5 is a top view of a first substrate 100a according to another embodiment of the present disclosure. FIG. 6 is a top view of a second substrate 200a according to another embodiment of the present disclosure. Reference is made to FIG. 5 and FIG. 6, the regions illustrated in FIG. 5 and FIG. 6 correspond to the region R labeled in FIG. 1. The difference between the first substrate 100 in FIG. 5 and the first substrate 100 in FIG. 3 is that the number of the third circuits 140a is plural. The difference between the second substrate 200 in FIG. 6 and the second substrate 200 in FIG. 4 is that the number of the sixth circuits 240a is plural. The second substrate 200 further includes three extension circuits 250 respectively connected to two sixth circuits 240a. The extension circuits 250 are separated from each other, and each of the extension circuits 250 are connected to two sixth circuits 240a. For example, in the present embodiment, positions of adjacent two sixth circuits 240a connected with the extension circuits 250 located at left-hand side and the center may correspond to the position of the third circuit 140a with greater area. When the poor bonding situation occurs between these circuits, the impedance of at least one extension circuits 250 may be abnormal. Therefore, the poor bonding situation between the first bonding region 110 and the second bonding region 210 may be determined through the abnormal impedance measured through the detecting contacts 310. In the present embodiment, the extension circuits 250 are located in the first substrate 100. In other embodiments, the extension circuits 250 may also located on the second substrate 200. The numbers and distribution of the third circuits 140a and the sixth circuits 240a may be adjusted based on requirements so as to enhance quality of bonding detection.

Figure 7:
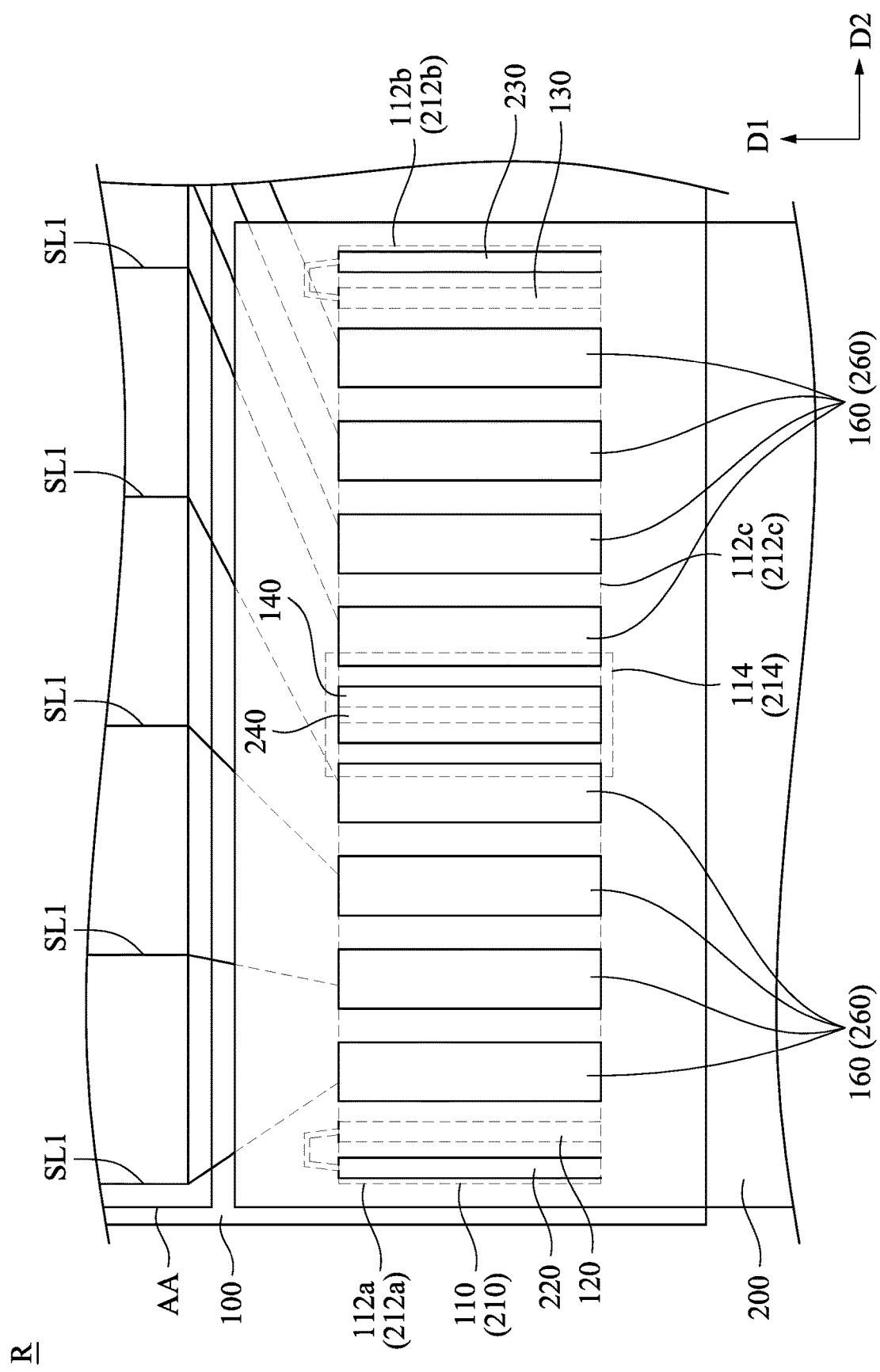
FIG. 7 is a top view of an electronic device according to another embodiment of the present disclosure.

FIG. 7 is a top view of an electronic device 20 according to another embodiment of the present disclosure. As shown in FIG. 7, after the bonding quality is tested, the extension circuit 150 and/or the detection region 300 may be removed. The first circuit 120, the second circuit 130, and the third circuit 140 are left on the first substrate 100, and the fourth circuit 220, the fifth circuit 230, and the sixth circuits 240 are left on the second substrate 200.

As described above, since the third circuit of the first substrate and the sixth circuit of the second substrate are respectively located between the first circuit and the second circuit and between the fourth circuit and the fifth circuit, the bonding situation at the position close to the edge of the first bonding region and the second region can be detected. Comparing to a typical device of which the detecting circuits are merely located at two edges of the bonding region, designs of the first bonding region and the second bonding region may increase the detection precision. In addition, the numbers and distribution of the third circuits and the sixth circuits may be adjusted based on requirements so as to enhance quality of bonding detection. Accordingly, the products which are poorly bonded may be prevented from being misjudged as products that satisfy standards, thereby avoiding low yield in the subsequent processes or of the final products.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic device, comprising:
a first substrate having an active region, a first bonding region, a first circuit, a second circuit, a third circuit, a plurality of first conductive contacts, and an extension circuit electrically connected to the first circuit and the third circuit, wherein the first circuit is located at a first edge of the first bonding region, the second circuit is located at a second edge opposite to the first edge of the first bonding region, the third circuit is located between the first circuit and the second circuit, a portion of the first conductive contacts are located between the first circuit and the third circuit, another portion of the first conductive contacts are located between the second circuit and the third circuit, the extension circuit is located between the first bonding region and an edge of the first substrate, and the extension circuit is located at a side of the first bonding region away from the active region; and
a second substrate having a second bonding region corresponding to the first bonding region in position and a fourth circuit, a fifth circuit, a sixth circuit, and a plurality of second conductive contacts respectively corresponding to the first circuit, the second circuit, the third circuit, and the first conductive contacts in positions;
wherein when the first substrate is bonded with the second substrate, the first circuit, the second circuit, the third circuit, the fourth circuit, the fifth circuit, and the sixth circuit form a loop, and the first conductive contacts and the second conductive contacts are electrically connected to a plurality of signal circuits corresponding to the first conductive contacts and the second conductive contacts.

2. The electronic device of claim 1, wherein the first bonding region includes a central region, the second bonding region includes a central region, the third circuit is located in the central region of the first bonding region, and the sixth circuit is located in the central region of the second bonding region.

3. The electronic device of claim 1, wherein the first conductive contacts are electrically connected to the signal circuits of the active region, and the second conductive contacts are electrically connected to the signal circuits of a printed circuit board.

4. The electronic device of claim 1, wherein the first circuit, the second circuit, the third circuit, the fourth circuit, the fifth circuit, and the sixth circuit are electrically insulated from the signal circuits.

5. The electronic device of claim 1, wherein the fourth circuit, the fifth circuit, and the sixth circuit of the second substrate are spaced apart from each other.

6. The electronic device of claim 1, wherein the first circuit, the second circuit, and the third circuit extend outside the first bonding region, and the extension circuit is located outside the first bonding region.

7. The electronic device of claim 1, wherein the second substrate further comprises a detecting region, the detecting region includes at least one detecting contact, and the detecting contact is connected to the fourth circuit and the fifth circuit.

8. The electronic device of claim 7, wherein the detecting region is located outside the second bonding region.

9. An electronic device, comprising:
a first substrate having a first bonding region, a first circuit, a second circuit, a third circuit, and a plurality of first conductive contacts, wherein the first circuit is located at a first edge of the first bonding region, the second circuit is located at a second edge opposite to the first edge of the first bonding region, the third circuit is located between the first circuit and the second circuit, a portion of the first conductive contacts are located between the first circuit and the third circuit, and another portion of the first conductive contacts are located between the second circuit and the third circuit; and
a second substrate having a second bonding region corresponding to the first bonding region in position and a fourth circuit, a fifth circuit, a sixth circuit, a detecting region, and a plurality of second conductive contacts respectively corresponding to the first circuit, the second circuit, the third circuit, and the first conductive contacts in positions, the detecting region includes at least one detecting contact, and the detecting contact is connected to the fourth circuit and the fifth circuit;

wherein when the first substrate is bonded with the second substrate, the first circuit, the second circuit, the third circuit, the fourth circuit, the fifth circuit, and the sixth circuit form a loop, and the first conductive contacts and the second conductive contacts are electrically connected to a plurality of signal circuits corresponding to the first conductive contacts and the second conductive contacts.

10. The electronic device of claim 9, wherein the first bonding region includes a central region, the second bonding region includes a central region, the third circuit is located in the central region of the first bonding region, and the sixth circuit is located in the central region of the second bonding region.

11. The electronic device of claim 9, wherein the first conductive contacts are electrically connected to the signal circuits of an active region, and the second conductive contacts are electrically connected to the signal circuits of a printed circuit board.

12. The electronic device of claim 9, wherein the first circuit, the second circuit, the third circuit, the fourth circuit, the fifth circuit, and the sixth circuit are electrically insulated from the signal circuits.

13. The electronic device of claim 9, wherein the fourth circuit, the fifth circuit, and the sixth circuit of the second substrate are spaced apart from each other.

14. The electronic device of claim 9, wherein the first substrate further comprises an extension circuit electrically connected to the first circuit and the third circuit, the first circuit, the second circuit, and the third circuit extend outside the first bonding region, and the extension circuit is located outside the first bonding region.

15. The electronic device of claim 9, wherein the detecting region is located outside the second bonding region.

16. The electronic device of claim 9, wherein the second substrate further comprises an extension circuit electrically connected to the fourth circuit and the sixth circuit, and the extension circuit of the second substrate is located in the second bonding region.

17. An electronic device, comprising:
a first substrate having a first bonding region, a first circuit, a second circuit, a third circuit, and a plurality of first conductive contacts, wherein the first circuit is located at a first edge of the first bonding region, the second circuit is located at a second edge opposite to the first edge of the first bonding region, the third circuit is located between the first circuit and the second circuit, a portion of the first conductive contacts are located between the first circuit and the third circuit, and another portion of the first conductive contacts are located between the second circuit and the third circuit; and a second substrate having a second bonding region corresponding to the first bonding region in position and a fourth circuit, a fifth circuit, a sixth circuit, an extension circuit electrically connected to the fourth circuit and the sixth circuit, and a plurality of second conductive contacts respectively corresponding to the first circuit, the second circuit, the third circuit, and the first conductive contacts in positions, and the extension circuit of the second substrate is located in the second bonding region;

wherein when the first substrate is bonded with the second substrate, the first circuit, the second circuit, the third circuit, the fourth circuit, the fifth circuit, and the sixth circuit form a loop, and the first conductive contacts and the second conductive contacts are electrically connected to a plurality of signal circuits corresponding to the first conductive contacts and the second conductive contacts.

18. The electronic device of claim 17, wherein the first substrate further comprises an extension circuit electrically connected to the first circuit and the third circuit, the extension circuit of the first substrate is located between the first bonding region and an edge of the first substrate, and the extension circuit of the first substrate is located at a side of the first bonding region away from an active region.

19. The electronic device of claim 18, wherein the first circuit, the second circuit, and the third circuit extend outside the first bonding region, and the extension circuit of the first substrate is located outside the first bonding region.

20. The electronic device of claim 17, wherein the second substrate further comprises a detecting region located outside the second bonding region, the detecting region includes at least one detecting contact, and the detecting contact is connected to the fourth circuit and the fifth circuit.

\* \* \* \* \*